United States Patent
Nikawa

[11] Patent Number: 6,072,327
[45] Date of Patent: Jun. 6, 2000

[54] METHOD AND DEVICE OF TESTING SEMICONDUCTOR INTEGRATED CIRCUIT CHIP CAPABLE OF PREVENTING ELECTRON-HOLE PAIRS

[75] Inventor: Kiyoshi Nikawa, Tokyo, Japan

[73] Assignee: NEC Corporation, Tokyo, Japan

[21] Appl. No.: 09/115,998

[22] Filed: Jul. 15, 1998

Related U.S. Application Data

[62] Division of application No. 08/653,834, May 28, 1996, Pat. No. 5,815,002.

[30] Foreign Application Priority Data

May 26, 1995 [JP] Japan .................................... 7-128049

[51] Int. Cl.$^7$ ................................................... G01R 31/26
[52] U.S. Cl. .......................... 324/765; 324/760; 324/752
[58] Field of Search ..................................... 324/760, 752, 324/750, 751, 765, 753; 438/18, 11; 257/48; 73/599, 606, 626

[56] References Cited

U.S. PATENT DOCUMENTS

| | | | |
|---|---|---|---|
| 3,846,565 | 11/1974 | Rosenberg et al. ...................... | 426/238 |
| 3,914,655 | 10/1975 | Dreyfus et al. .............................. | 317/4 |
| 4,736,159 | 4/1988 | Shiragasawa et al. .................. | 324/752 |
| 4,872,212 | 10/1989 | Kamieniecki ............................ | 324/765 |
| 4,891,584 | 1/1990 | Kamieniecki et al. .................. | 324/752 |
| 4,911,805 | 3/1990 | Ando et al. ............................... | 204/164 |
| 5,046,363 | 9/1991 | Moore ....................................... | 73/588 |
| 5,087,876 | 2/1992 | Reiss et al. .............................. | 324/73.1 |
| 5,164,040 | 11/1992 | Eres et al. ................................. | 156/610 |
| 5,631,425 | 5/1997 | Wang et al. .............................. | 73/606 |
| 5,641,906 | 6/1997 | Moore ....................................... | 73/606 |

FOREIGN PATENT DOCUMENTS 6300824 10/1994 Japan .

OTHER PUBLICATIONS

"Novel Method for Detection of . . . Resistance," Jpn. J. Appl. Phys. vol. 34, pp. 2260–2265, May 1995.

Kiyoshi Nikawa et al., Internal Current Imaging of Integrated Circuit Using Optical/Electron/Ion Beam Induced Resistance Change Method (Text in Japanese—Source Unknown) Dec., 1994.

T. Koyama et al., "Bias–free evaluation techniques for Al . . . high sensitive OBIC", Publication of Extended Absts (The 55th Autumn Mtg, 1994), *The Japan Society of Applied Physics,* 22a–ZP 10, p. 586.

K. Nikawa et al., "Novel Method for Defect Detection in Al Stripes by Means . . . and Detection of Changes in Electrical Resistance", *Jpn. J. Appl. Phys.,* vol. 34, Part 1, No. 5A, May 1995, p. 2260–2265.

*Primary Examiner*—Josie Ballato
*Assistant Examiner*—T. R. Sundaram
*Attorney, Agent, or Firm*—Sughreu, Mion, Zinn, Macpeak & Seas, PLLC

[57] ABSTRACT

While an ultrasonic wave beam producing device scans an ultrasonic wave beam 5 across a semiconductor integrated circuit chip 2, a current through the circuit chip is detected. In this way, the semiconductor integrated circuit chip may be accurately tested, and the creation of electron-hole pairs is avoided.

3 Claims, 16 Drawing Sheets

METHOD AND DEVICE OF TESTING SEMICONDUCTOR INTEGRATED CIRCUIT CHIP CAPABLE OF PREVENTING ELECTRON-HOLE PAIRS

This is a divisional of application Ser. No. 08/653,834 filed May 28, 1996, now U.S. Pat. No. 5,815,002, the disclosure of which is incorporated herein by reference.

FIELD OF THE INVENTION

The invention relates to a method and a device of testing a semiconductor integrated circuit chip, and more particularly to a method and a device which detect a change of a current or a voltage in a semiconductor integrated circuit chip.

BACKGROUND OF THE INVENTION

Conventional methods and devices of the type described are based a following principle. When a constant voltage is supplied between two ones of terminals of a semiconductor integrated circuit, and when a beam such as a laser beam, electron beam, or a ion beam is projected to the semiconductor integrated circuit chip, a change of a current in the semiconductor integrated circuit is caused by a change of a temperature caused by beam irradiation and heating of the semiconductor integrated circuit. The change of the current ($\Delta I$) is defined by an equation (1).

$$\Delta I = (\Delta R/R)I \quad (1)$$

In the equation (1), R represents a resistance of the circuit when the chip is not supplied with the beam, $\Delta R$ represents a change of the resistance of the circuit when the chip is supplied with the beam and heated, I represents a current of the circuit when the chip is not supplied with the beam.

In this event, R is constant. Therefore, it is possible to detect a product of $\Delta R$ and I by detecting $\Delta I$. In addition, it is possible to detect $\Delta R$ when I is constant. Also, it is possible to detect I when $\Delta R$ is constant.

A first conventional method or device is disclosed in Japanese Unexamined Patent Prepublication (Kokai) No. 300824/1994. This first conventional method comprises a fist step of projecting the beam on the chip during scanning the beam while a constant voltage is supplied to the circuit, and a simultaneous second step of detecting a change of a current in the circuit.

When conditions of the beams are same and when qualities of the material portions (if the chip supplied with the beam are same, differences of $\Delta R$ in the portions of the chip are caused by differences of heat conduction in the portions of the chip. If there is a fault that the chip has voids and Si nodules, heat conduction in the portions of the chip, e.g., in Al interconnects that has voids and Si nodules are different. Therefore, this conventional method detects a change of a current in the circuit to detect voids and Si nodules in the portions of the chip, e.g., in Al interconnects A second conventional method is disclosed in Japanese Patent Application No. 230672/1994. This second conventional method detects I when $\Delta R$ is constant. A signal detected by the first and second conventional methods is hereinafter called BIRCH signal.

A third conventional method is disclosed in Publication of Extended Abstracts (The 55th Autumn Meeting, 1994): The Japan Society of Applied Physics; 22a-ZP 10, p. 586 of Koyama et al. This third conventional method is called an NBOBIC method. This third conventional method comprises a step of projecting a laser beam on the chip; and a simultaneous step of detecting a current of the chip while the chip is supplied with the laser beam. If there is a fault that the chip has voids, thermoelectric powers in the portions of the chip, e.g., in Al interconnects that has voids are different. As a result, thermoelectricmotives causes by differences of thermoelectric powers. Therefore, this conventional method detects changes of currents in the circuit that are caused by the thermoelectricmotives. A signal detected by the third conventional method is hereinafter called NBOBIC signal.

However, the conventional methods for using the laser beam or the electron beam have a disadvantage in that currents are generated in the chip because electron-hole pairs are generated in a semiconductor in a substrate of the chip.

A signal of the current generated by the electron-hole pair is hereinafter called OBIC signal. The OBIC signal is overlapped to the BIRCH signal. In addition, the OBIC signal is stronger than the BIRCH signal. Also, the conventional methods have a dynamic range which has not a width that is capable of amplifying both the OBIC signal and the BIRCH signal. Therefore, inasmuch as the conventional methods are incapable of distinguishing between the OBIC signal and the BIRCH signal, the conventional methods are incapable of detecting the BIRCH signal. Similarly, the conventional methods are incapable of detecting the NBOBIC signal. In addition, inasmuch as the conventional methods are incapable of distinguishing between a EBIC (Electron Beam Induced Current) signal and the BIRCH(and NBEBIC) signal, the conventional methods are incapable of detecting the BIRCH(and NBEBIC) signal.

Also, the conventional methods for using the ion beam have a disadvantage in that the ion beam sputters the chip to destroy the chip.

SUMMARY OF THE INVENTION

Accordingly, it is an object of the invention to provide a method and a device of testing a semiconductor integrated circuit chip that does not generate the electron-hole pairs in the semiconductor integrated circuit chip.

It is another object of the invention to provide a method and a device of testing a semiconductor integrated circuit chip that does not destroy the semiconductor integrated circuit chip.

Other objects of the invention will become clear as the description proceeds.

According to a second aspect of the invention, there is provided a method of testing a semiconductor integrated circuit chip that comprises the steps of:

projecting a supersonic wave beam on the semiconductor integrated circuit chip; and detecting a change of a current in a semiconductor integrated circuit in the semiconductor integrated circuit chip while the semiconductor integrated circuit chip is supplied with the supersonic wave beam.

According to a sixth aspect of the invention, there is provided a device of testing a semiconductor integrated circuit chip comprising:

supersonic wave beam projecting means for projecting a supersonic wave beam on a semiconductor integrated circuit chip; and current change detecting means for detecting a change of a current in a semiconductor integrated circuit in the semiconductor integrated circuit chip.

BRIEF DESCRIPTION OF THE DRAWINGS

The invention will be explained in more in detail in conjunction with appended drawings, wherein.

DESCRIPTION OF THE PREFERRED EMBODIMENTS

Figure 1:
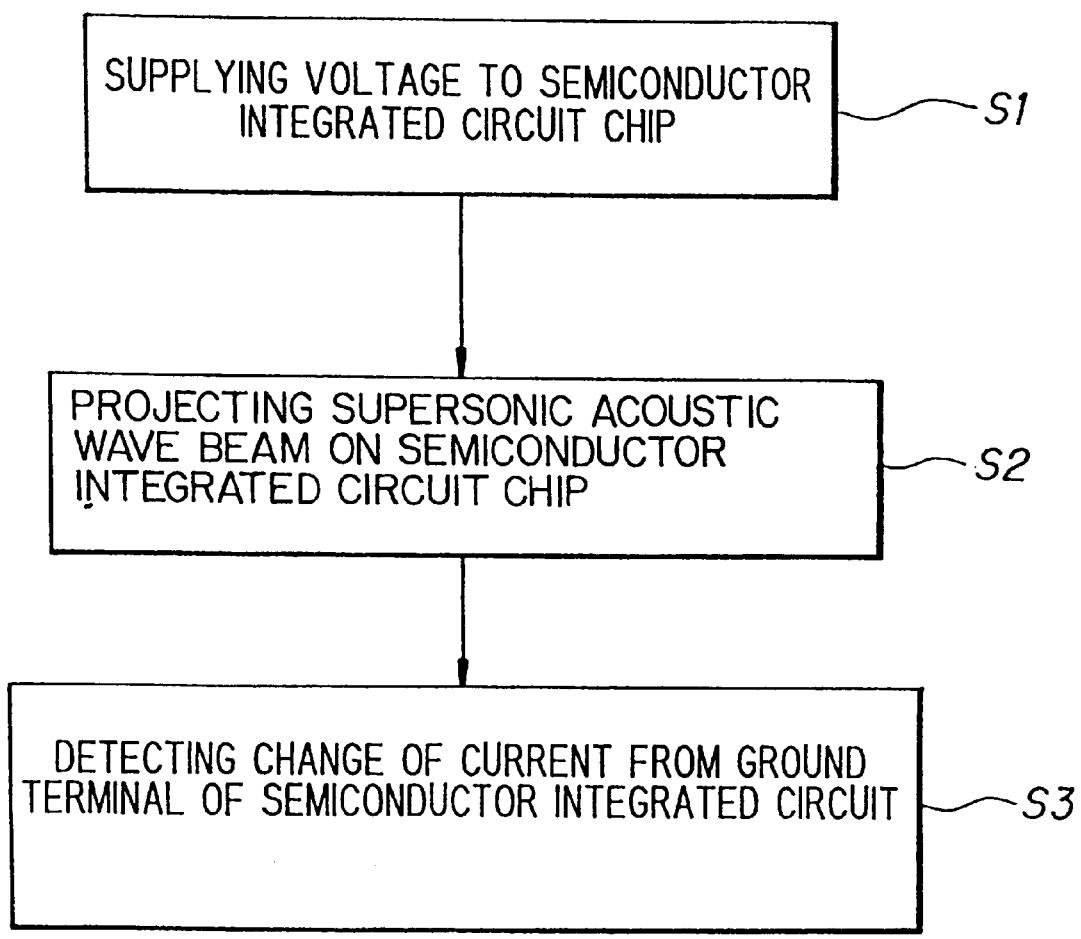
FIG. 1 is a flow chart for use in describing a method of testing a semiconductor integrated circuit chip according to a first embodiment of the invention.
Figure 2:
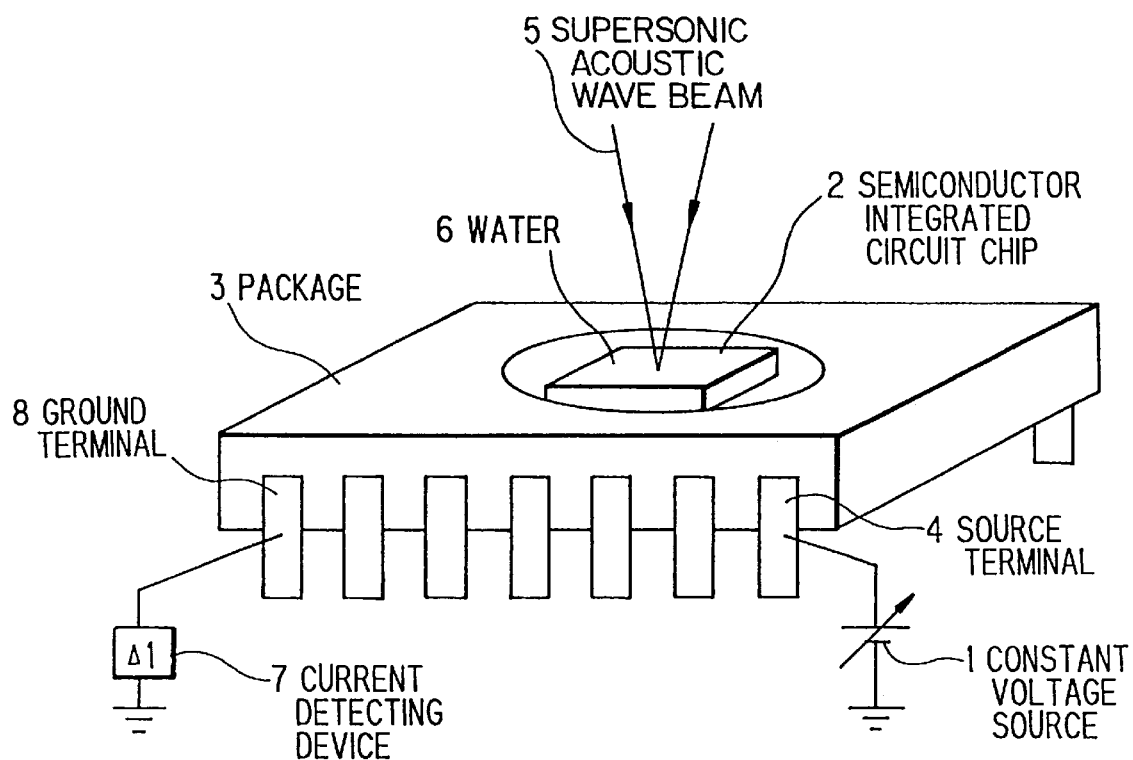
FIG. 2 is a schematic perspective view for use in describing the method of testing a semiconductor integrated circuit chip according to the first embodiment of the invention.

Referring to FIGS. 1 and 2, the description will proceed to a method of testing a semiconductor integrated circuit chip according to a first embodiment of the invention.

It should be noted that the term "supersonic acoustic wave beam(s)" used throughout the specification and figures is intended to refer to wave beams having frequencies above the range of normal human hearing, i.e., ultrasonic wave beams.

At a step S1, a constant voltage source 1 supplies a voltage to a semiconductor integrated circuit (not shown) in a semiconductor integrated circuit chip 2 which is supported by a package 3. The constant voltage source 1 is connected to a source terminal 4 attached to the package 3.

Next, at a step S2, a supersonic acoustic wave beam producing device (not shown) projects a supersonic wave beam 5 on the semiconductor integrated circuit chip 2 while the voltage is supplied to a semiconductor integrated circuit in the semiconductor integrated circuit chip 2. In this event, liquid such as water 6 that transfers supersonic acoustic wave beam is held by surface tension on a surface of the semiconductor integrated circuit chip 2. For example, the water 6 is dropped on surface of the semiconductor integrated circuit chip 2 by using a filler. Also, in this event, the semiconductor integrated circuit chip 2 is positioned in the atmosphere.

Next, at a step S3, a current detecting device 7 detects a change of a current which flows out from a ground terminal 8 of the semiconductor integrated circuit. The current detecting device 7 may detect a change of a current which f lows in the source terminal 4 or a signal terminal. Inasmuch as a total current in the semiconductor integrated circuit flows out from a ground terminal 8, the current detecting device preferably detects the change of the current which flows out from the ground terminal 8 when an output terminal is opened, namely, is not connected to a load.

In the method, when a portion of the semiconductor integrated circuit chip 2 is supplied with the supersonic acoustic wave beam 5, a thermoelectric power of the portion becomes active to cause a potential difference. Therefore, the method detects the change of the current which is caused by the potential difference- The current is transiently caused. If the chips 2 has a fault that the chip 2 has voids and Si nodules, thermoelectric power in the portion of the chip 2 that has voids and Si nodules changes. As a result, thermoelectric power in the portion of the chip 2 that has voids and Si nodules is difference from that in the portion of the chip 2 that has no voids and no Si nodules. Accordingly, the method detects the change of the current to detect the fault of chip 2.

Figure 3:
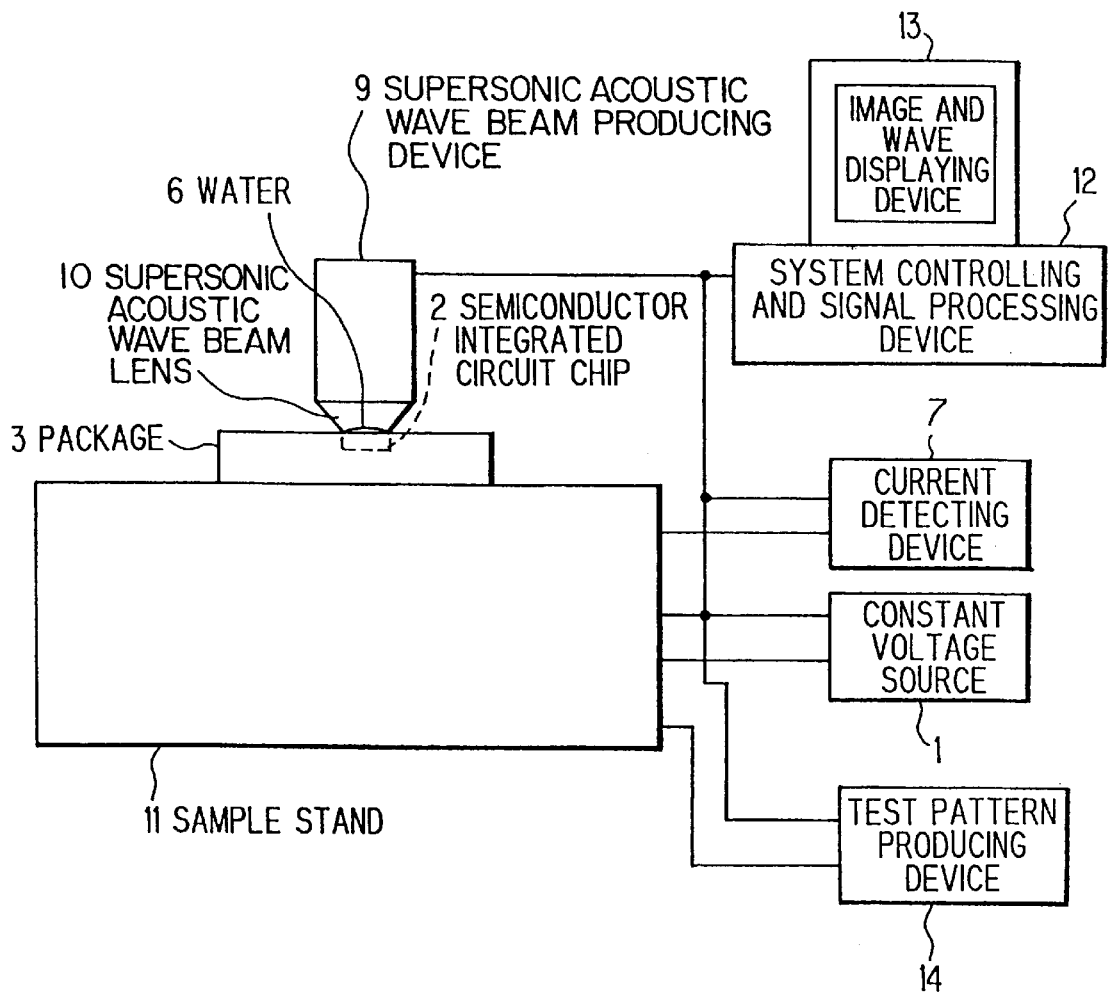
FIG. 3 is a view of a semiconductor integrated circuit chip testing device according to a second embodiment of the invention.

Referring to FIG. 3, the description will proceed to a semiconductor integrated circuit chip testing device according to a second embodiment of the invention.

The semiconductor integrated circuit chip testing device comprises a supersonic acoustic wave beam producing device 9, a supersonic acoustic wave beam lens 10, a sample stand 11, the constant voltage source 1, the current detecting device 7, a system controlling and signal processing device 12, an image and wave displaying device 13, and a test pattern producing device 14.

The semiconductor integrated circuit chip 2 and the package 3 is set on the sample stand 11. The water 6 is held on the surface of the semiconductor integrated circuit chip 2 which is positioned in the atmosphere. The sample stand 11 is movable in X-axis, Y-axis, and Z-axis directions.

The supersonic acoustic wave beam producing device 9 produces the supersonic acoustic wave beam which has a frequency of 1 to 3 GHz. The supersonic acoustic wave beam has a wavelength of 0.5 to 1.5 μm in the water 6. The supersonic acoustic wave beam lens 10 convergence the supersonic acoustic wave beam from the supersonic acoustic wave beam producing device 9. The system controlling and signal processing device 12 controls a system and processes obtained signals. The image and wave displaying device 13 displays current images, fault images, and current wave forms. The test pattern producing device 14 produces a test pattern signal which sets a specific state of the semiconductor integrated circuit.

The supersonic acoustic wave beam producing device 9 projects a supersonic acoustic wave beam 5 on the semiconductor integrated circuit chip 2 while the voltage is supplied from the constant voltage source 1 to a semiconductor integrated circuit in the semiconductor integrated circuit chip 2 and while the sample stand 11 is moved and stopped.

When we observe current images and fault images by using the device, the supersonic acoustic wave beam 5 is scanned on an area of the semiconductor integrated circuit chip 2 that is observed. When we observe a current wave form by using the device, the supersonic acoustic wave beam 5 is projected to a point of the semiconductor integrated circuit chip 2 that is observed. When we observe current wave forms, current images, and fault images by using the device, the test pattern producing device 14 supplies the test pattern signal to the semiconductor integrated circuit.

Figure 4:
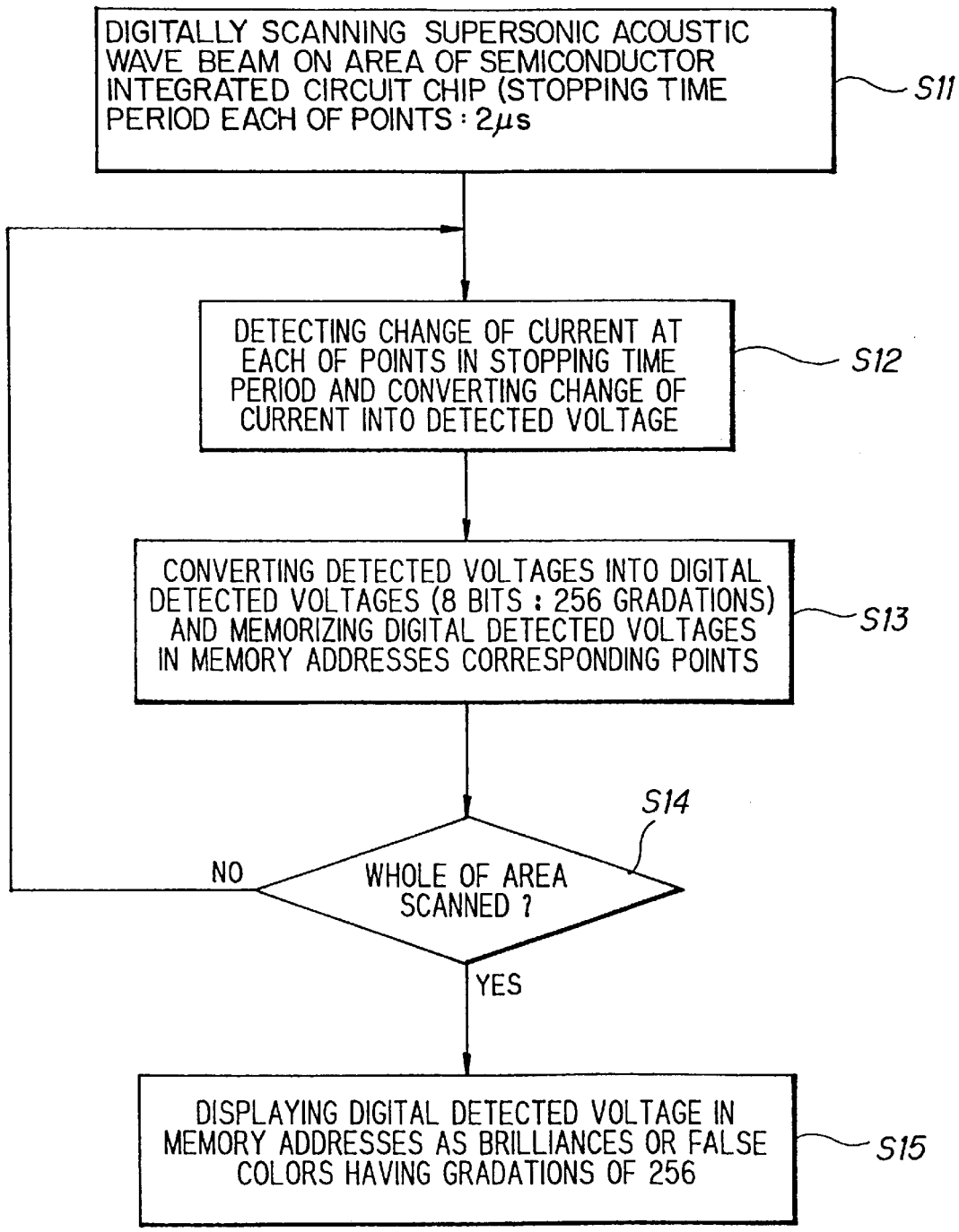
FIG. 4 is a flow chart for use in describing a method of testing a semiconductor integrated circuit chip according to a third embodiment of the invention.

Referring to FIG. 4, the description will proceed to a method of testing a semiconductor integrated circuit chip according to a third embodiment of the invention.

FIG. 4 shows the method for displaying current images and fault images by using the device. At a step S11, the device digitally scans the supersonic acoustic wave beam 5 on the area of the semiconductor integrated circuit chip 2 that is observed. In this event, the device digitally scans the supersonic acoustic wave beam 5 at points of 262,144 in the area that is a product of 512 (lengthwise) and 512 (crosswise). A stopping time period in which the supersonic acoustic wave beam 5 is stopped at each of the points is 2 $\mu$s. A time period in which the device digitally once scans the supersonic acoustic wave beam 5 on the area is 0.5 second.

At a step S12, the current detecting device 7 detects a change of a current at each of the points of the area in the stopping time period to converts the change of the current into a detected voltage. At a step S13, the system controlling and signal processing device 12 converts the detected voltages into digital detected voltages which has bits of 8 and gradations of 256. The system controlling and signal processing device 12 memorizes the digital detected voltages in memory addresses which correspond to the points of the area.

At a step S14, the system controlling and signal processing device 12 judges whether or not the device scans the supersonic acoustic wave beam 5 on whole of the area. When the device scans the supersonic acoustic wave beam 5 on whole of the area, the step S14 is followed by a step S15. Otherwise, the step S14 returns to the step S12

At a step S15, the image and wave displaying device 13 displays the digital detected voltages in memory addresses as brilliance or false colors which has gradations of 256.

Figure 5:
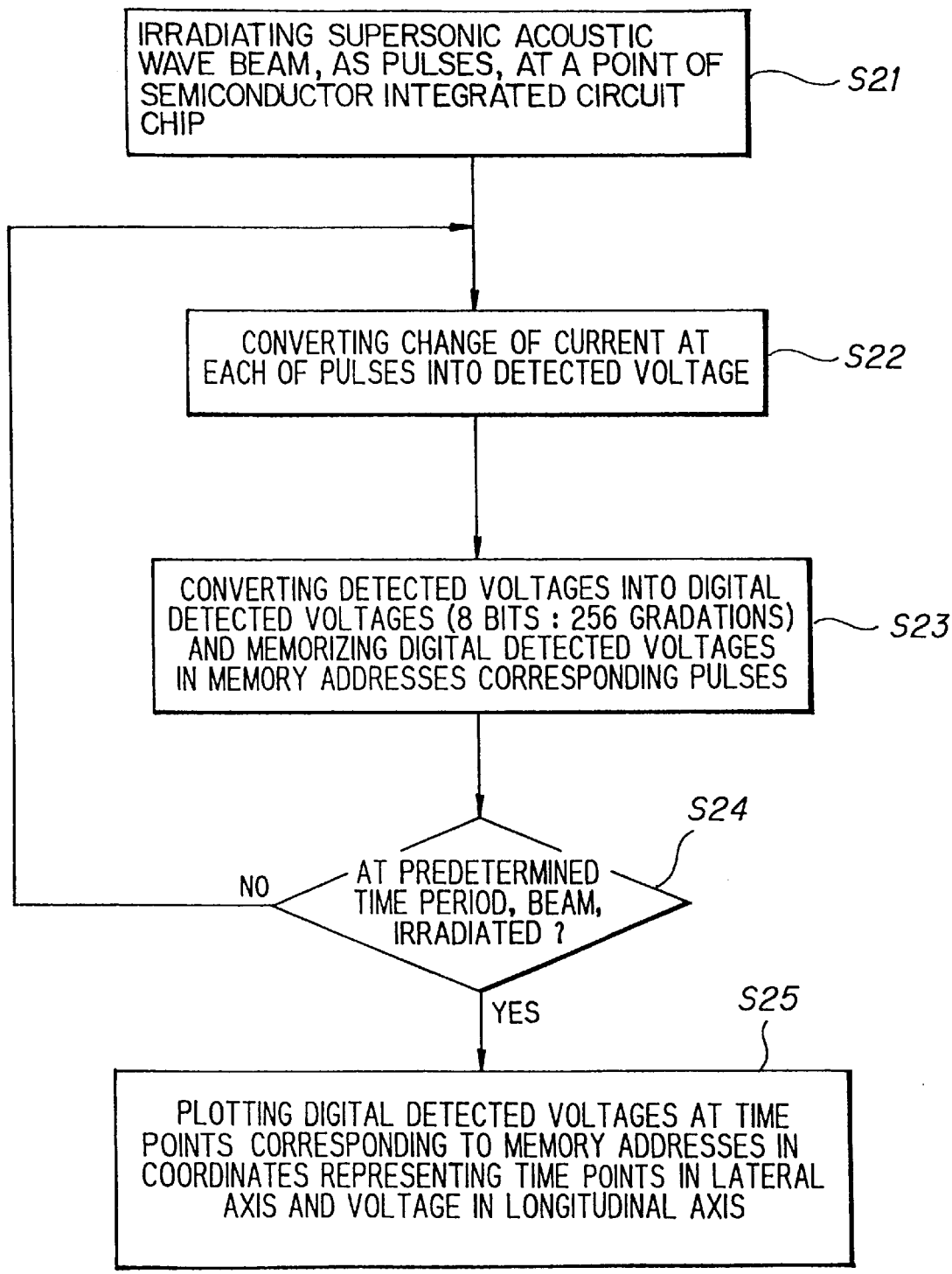
FIG. 5 is a flow chart for use in describing a method of testing a semiconductor integrated circuit chip according to a fourth embodiment of the invention.

Referring to FIG. 5, the description will proceed to a method of testing a semiconductor integrated circuit chip according to a fourth embodiment of the invention.

FIG. 5 shows the method for displaying current wave forms by using the device. At a step S21, the device irradiates, as pulses, the supersonic acoustic wave beam 5 on the point of the semiconductor integrated circuit chip 2 that is observed. Each of the pulses has a period of 2 $\mu$s and a pulse width of 1 $\mu$s.

At a step S22, the current detecting device 7 detects a change of a current at each of the pulses to converts the change of the current into a detected voltage. At a step S23, the system controlling and signal processing device 12 converts the detected voltages into digital detected voltages which has bits of 8 and gradations of 256. The system controlling and signal processing device 12 memorizes the digital detected voltages in memory addresses which correspond to the pulses.

At a step S24, the system controlling and signal processing device 12 judges whether or not the device irradiates the supersonic wave beam 5 at a predetermined time period. When the device irradiates the supersonic wave beam 5 at the predetermined time period, the step S24 is followed by a step S25. Otherwise, the step S24 returns to the step S22.

At a step S25, the image and wave displaying device 13 plots the digital detected voltages at time points corresponding to the memory addresses in a coordinates which represents a time points in lateral axis and a voltage a longitudinal axis. The current wave form is obtained by representing the digital detected voltages as detected current values.

In this event, if the supersonic acoustic wave beam 5 the pulses have short periods and short pulse widths, the device has a high resolution. When a sufficient S/N(signal to noise ratio) is not obtained by scanning once and when the detected current values periodically changes, the device synchronizes a repeat of operation of the step S22 to S24 with the period of the detected current values to add the digital detected voltages in a same phase to produce and memorize added voltages. Thereby, it is possible to improve the S/N.

Figure 6:
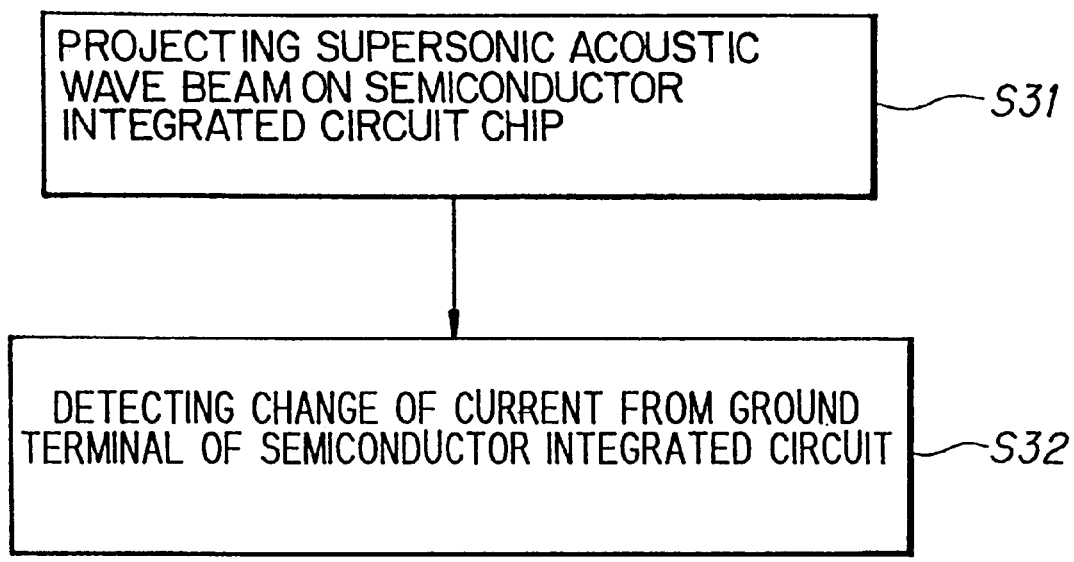
FIG. 6 is a flow chart for use in describing a method of testing a semiconductor integrated circuit chip according to a fifth embodiment of the invention.
Figure 7:
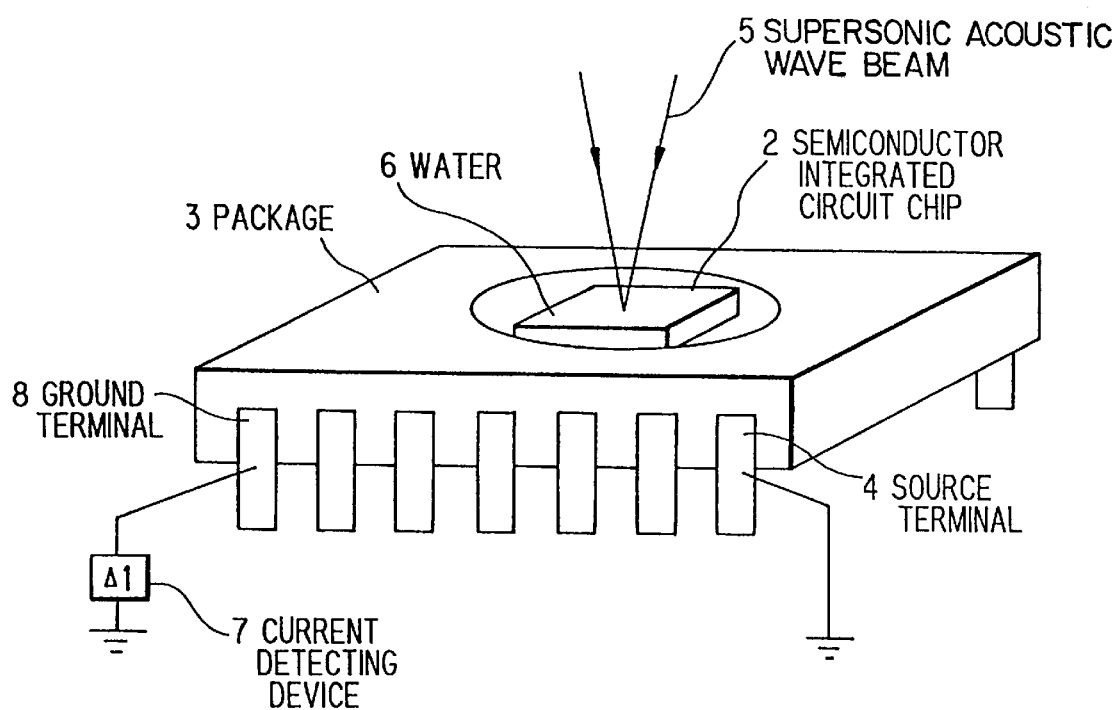
FIG. 7 is a schematic perspective view for use in describing a method of testing a semiconductor integrated circuit chip according to the fifth embodiment of the invention.
Figure 8:
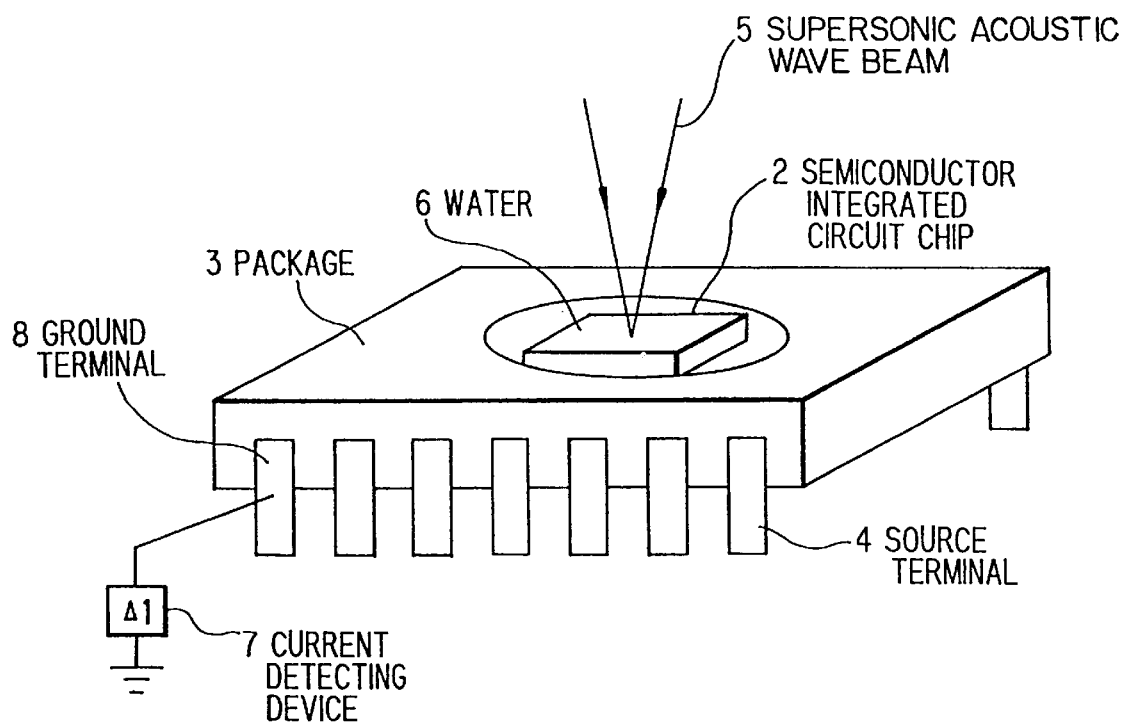
FIG. 8 is another schematic perspective view for use in describing a method of testing a semiconductor integrated circuit chip according to the fifth embodiment of the invention.

Referring to FIGS. 6, 7, and 8, the description will proceed to a method of testing a semiconductor integrated circuit chip according to a fifth embodiment of the invention.

In FIGS. 6, and 7, at a step S31, a supersonic acoustic wave beam producing device (not shown) projects a supersonic acoustic wave beam 5 on the semiconductor integrated circuit chip 2.

Next, at a step S32, a current detecting device 7 detects a change of a current which flows out from a ground terminal B of the semiconductor integrated circuit while the semiconductor integrated circuit chip 2 is supplied with the supersonic acoustic wave beam 5 and while the source terminal 4 is connected to ground. As shown FIG. 8, in this event, the source terminal 4 may not be connected to ground.

The method of FIGS. 6, 7, and 8 is similar to the method of FIGS. 1 and 2 except the constant voltage source 1.

The current detecting device 7 may detect a change of a current which flows in the source terminal 4 or a signal terminal. Inasmuch as a total current in the semiconductor integrated circuit flows out from the ground terminal 8, the current detecting device 7 preferably detects the change of the current which flows out from the ground terminal 8 when an output terminal is opened, namely, is not connected to a load.

Figure 9:
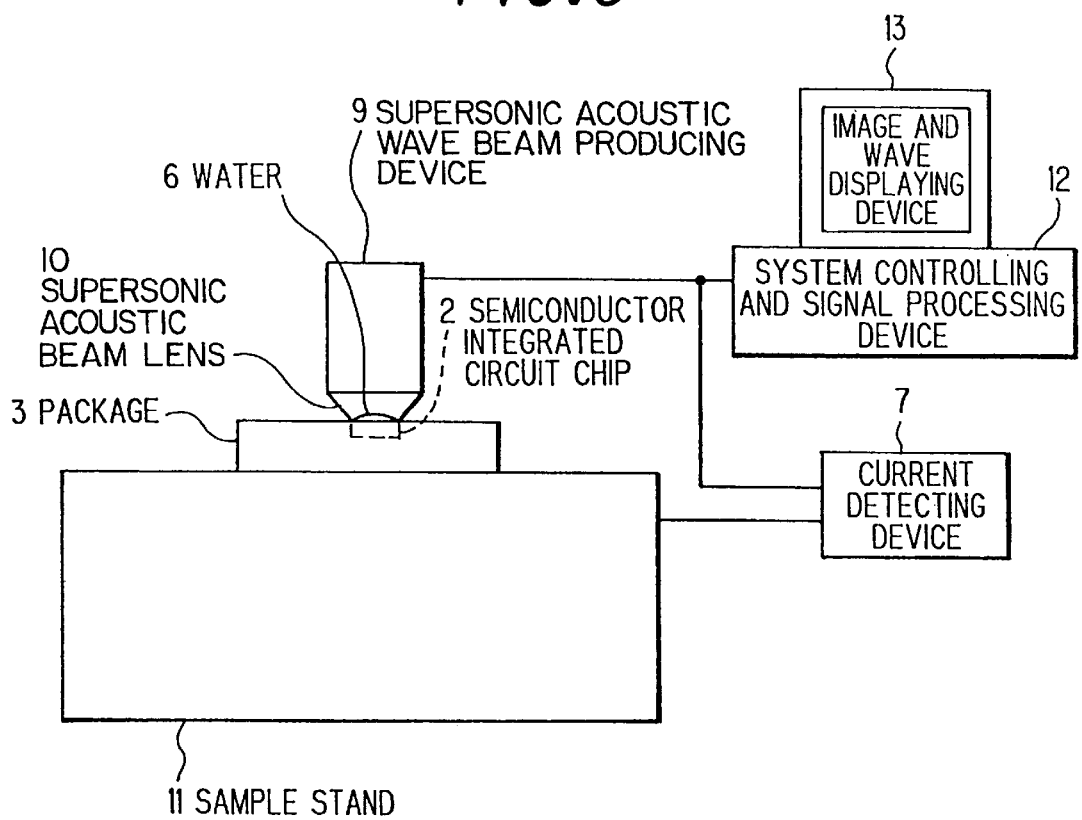
FIG. 9 is a view of a semiconductor integrated circuit chip testing device according to a sixth embodiment of the invention.

Referring to FIG. 9, the description will proceed to a semiconductor integrated circuit chip testing device according to a sixth embodiment of the invention.

The semiconductor integrated circuit chip testing device comprises the supersonic acoustic wave beam producing device 9, the supersonic acoustic wave beam lens 10, the sample stand 11, the current detecting device 7, the system controlling and signal processing device 12,and the image and wave displaying device 13. The device of FIG. 9 carries out operation of the device of FIG. 3 that is shown in FIG. 4. A device for carrying out the method of FIGS. 6, 7, and 8 may comprise the similar parts of the device of FIG. 3. In this event, the device is used when the current detecting device 7 detects a small change of current which flows out from the ground terminal 8 of the semiconductor integrated circuit while the chip 2 is supplied with the supersonic acoustic wave beam 5.

Figure 10:
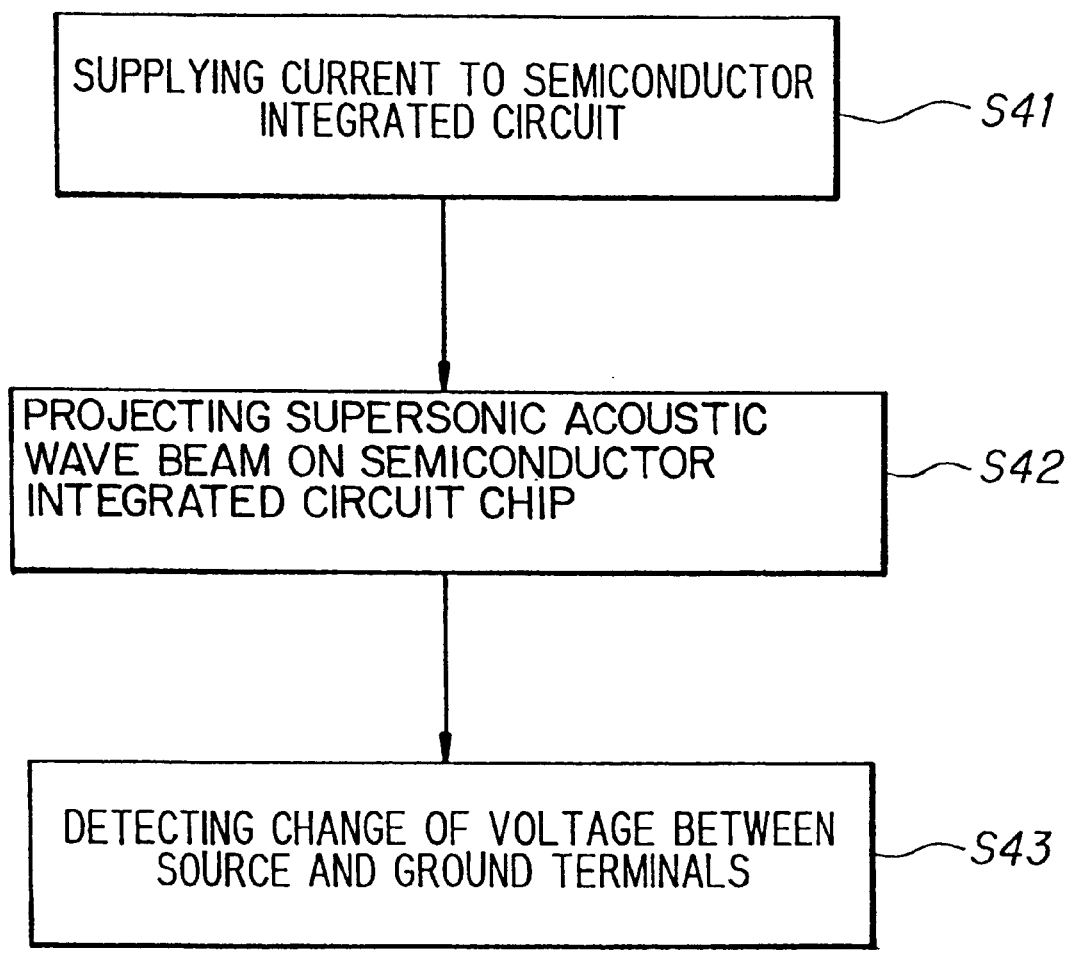
FIG. 10 is a flow chart for use in describing a method of testing a semiconductor integrated circuit chip according to a seventh embodiment of the invention.
Figure 11:
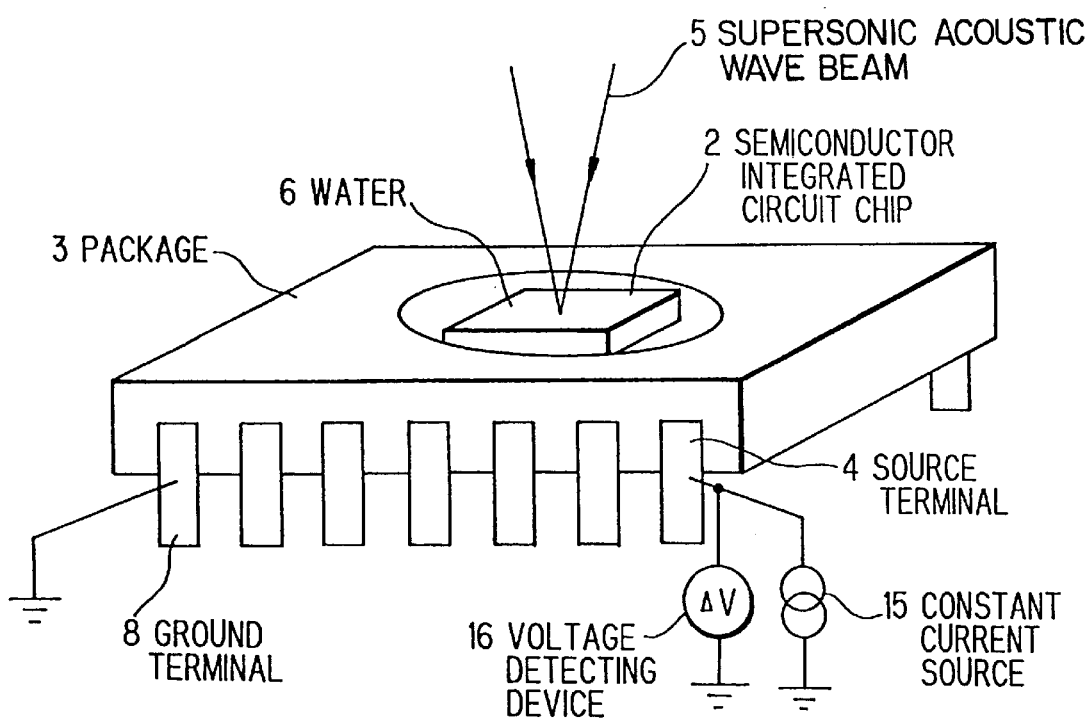
FIG. 11 is a schematic perspective view for use in describing a method of testing a semiconductor integrated circuit chip according to the seventh embodiment of the invention.

Referring to FIGS. 10 and 11, the description will proceed to a method of testing a semiconductor integrated circuit chip according to a seventh embodiment of the invention.

In FIGS. 10 and 11, at a step S41, a constant current source 15 supplies a current to the semiconductor integrated circuit in the semiconductor integrated circuit chip 2.

Next, at a step S42, a supersonic acoustic wave beam producing device (not shown) projects a supersonic acoustic wave beam 5 on the semiconductor integrated circuit chip 2 while the current is supplied to a semiconductor integrated circuit in the semiconductor integrated circuit chip 2.

Next, at a step S43, a voltage detecting device 16 detects a change of a voltage which is supplied between a source terminal 4 and the ground terminal 8 of the semiconductor integrated circuit while the semiconductor integrated circuit chip 2 is supplied with the supersonic acoustic wave beam 5.

The change of the voltage ($\Delta V$) is defined by an equation (2).

$$\Delta V = (\Delta R) I \qquad (2)$$

In the equation (2), $\Delta R$ represents a change of resistance of the circuit when the chip 2 is supplied with the supersonic acoustic wave beam 5 and I represents a current of the circuit when the chip 2 is not supplied with the supersonic acoustic wave beam 5.

As distinguished by the equation (2), the method can detect not only the fault such as voids of the chip 2 but also the current while the semiconductor integrated circuit chip 2 is supplied with the supersonic acoustic wave beam 5.

Figure 12:
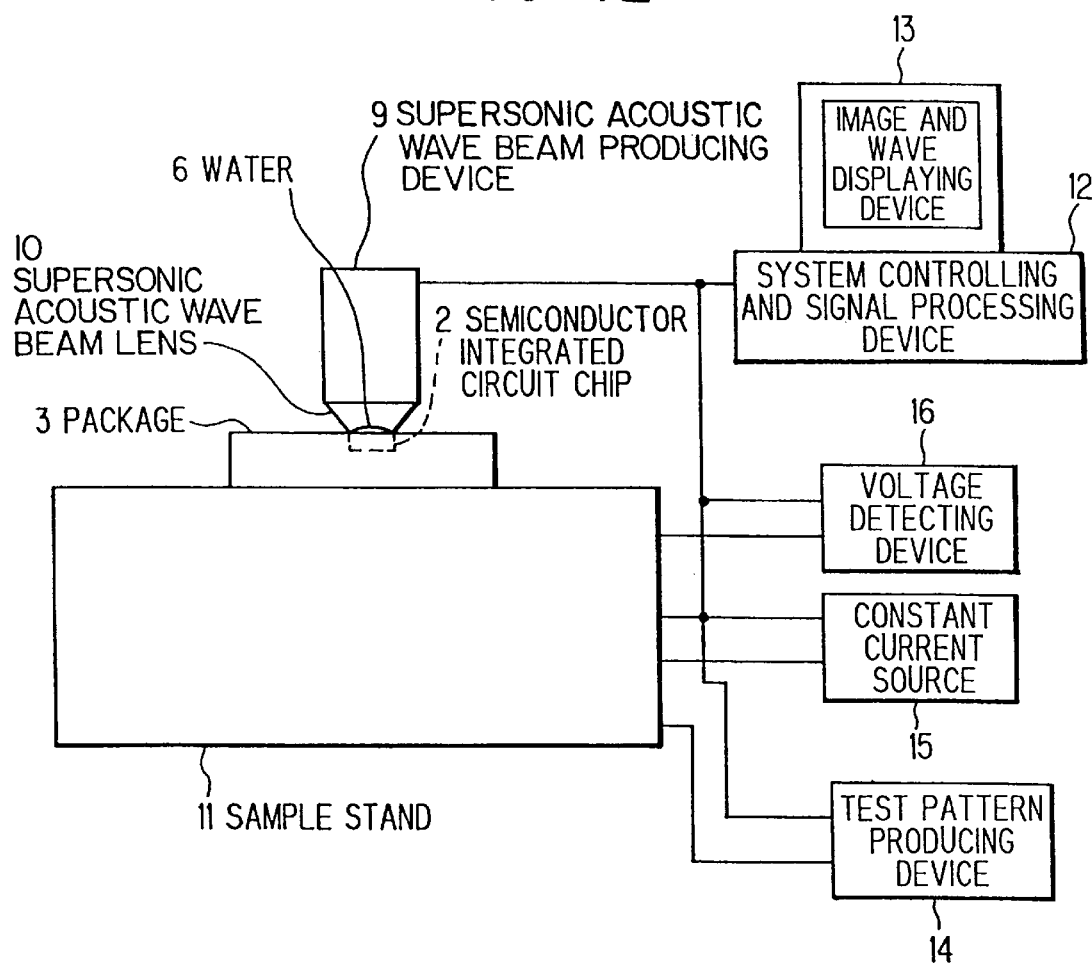
FIG. 12 is a view of a semiconductor integrated circuit chip testing device according to an eighth embodiment of the invention.

Referring to FIG. 12, the description will proceed to a semiconductor integrated circuit chip testing device according to a eighth embodiment of the invention. The semiconductor integrated circuit chip testing device comprises the supersonic acoustic wave beam producing device 9, the supersonic acoustic wave beam lens 10, the sample stand 11, the constant current source 15, the voltage detecting device 16, the system controlling and signal processing device 12, and the image and wave displaying device 13. The device of FIG. 12 carries out operation of the method of FIGS. 10 and 11.

Figure 13:
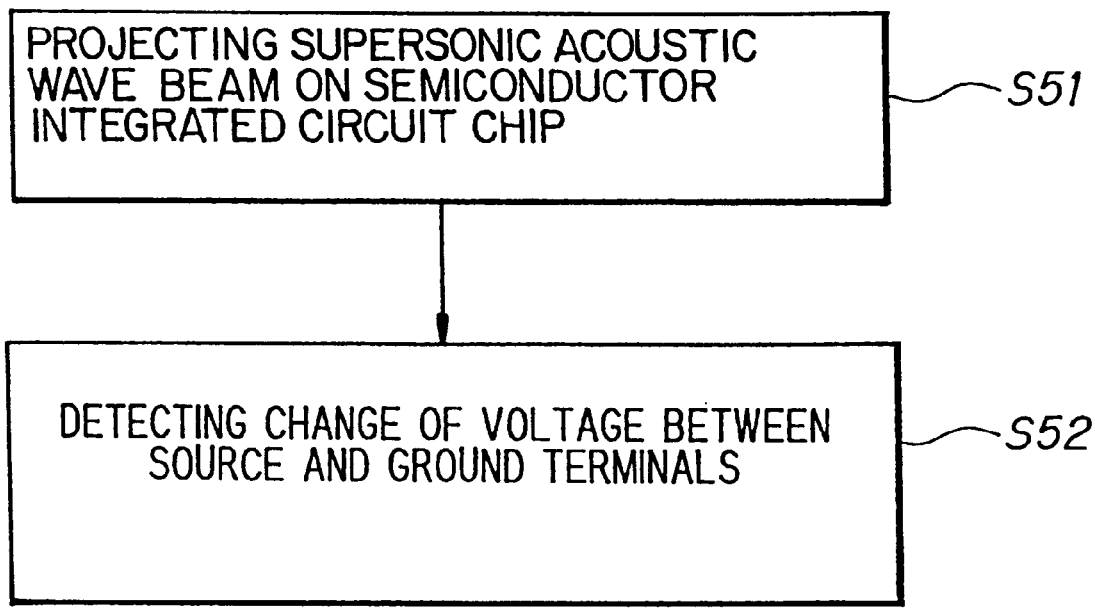
FIG. 13 is a flow chart for use in describing a method of testing a semiconductor integrated circuit chip according to a ninth embodiment of the invention.
Figure 14:
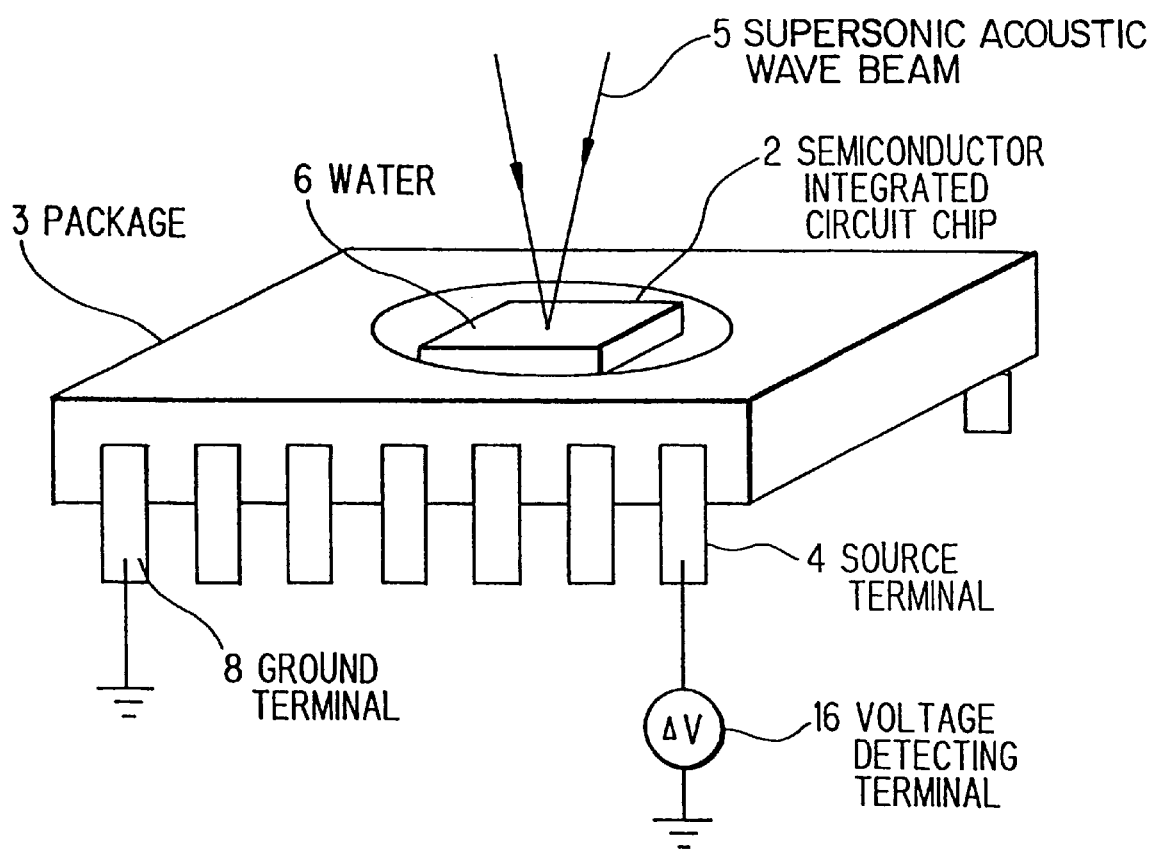
FIG. 14 is a schematic perspective view for use in describing a method of testing a semiconductor integrated circuit chip according to the ninth embodiment of the invention.
Figure 15:
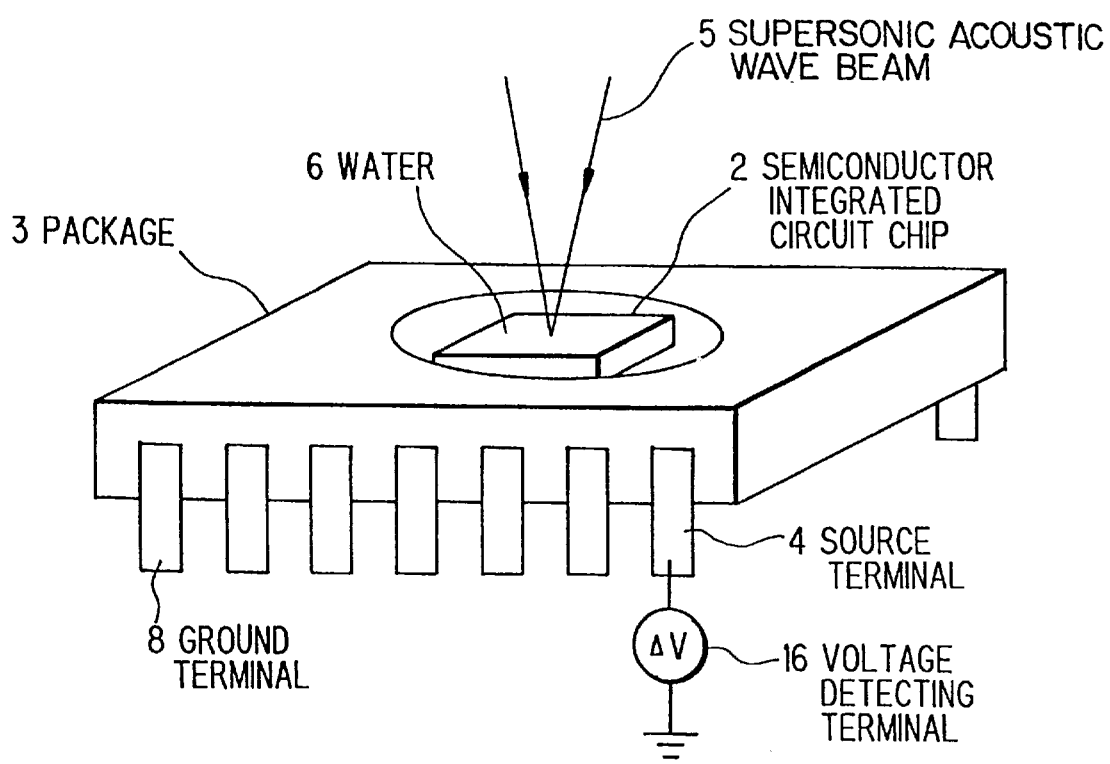
FIG. 15 is another schematic perspective view for use in describing a method o f testing a semiconductor integrated circuit chip according to the ninth embodiment of the invention.

Referring to FIGS. 13, 14, and 15, the description will proceed to a method of testing a semiconductor integrated circuit chip according to a ninth embodiment of the invention.

In FIGS. 13 and 14, at a step S51, a supersonic acoustic wave beam producing device (not shown) project a supersonic acoustic wave beam 5 on the semiconductor integrated circuit chip 2.

Next, at a step S52, the voltage detecting device 16 detects a change of a voltage which is supplied between the source terminal 4 and the ground terminal 8 of the semiconductor integrated circuit while the semiconductor integrated circuit chip 2 is supplied with the supersonic acoustic wave beam 5 and while the ground terminal 8 is connected to ground. As shown FIG. 15, in this event, the ground terminal 8 may not be connected to ground.

The method of FIGS. 13, 14, and 15 is similar to the method of FIGS. 10 and 11 except the constant current source 15.

Figure 16:
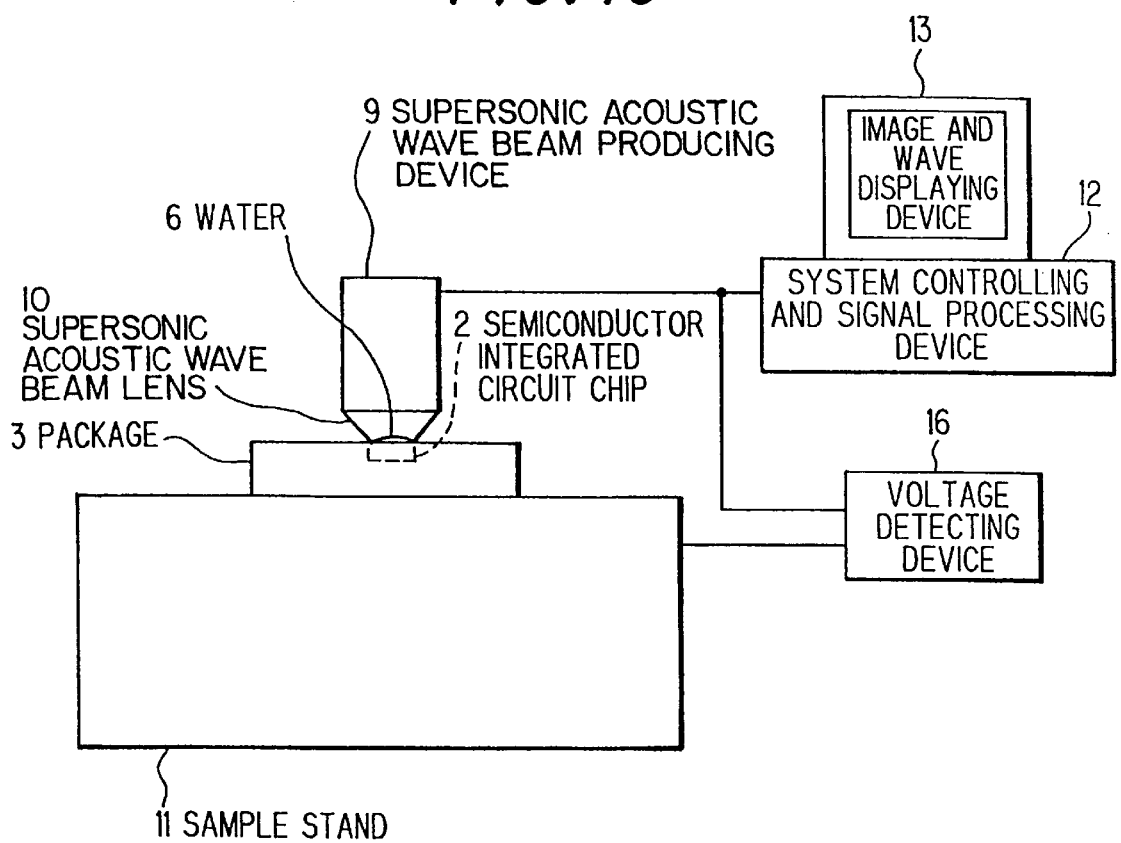
FIG. 16 a view of a semiconductor integrated circuit chip testing device according to a tenth embodiment of the invention.

Referring to PIG. 16, the description will proceed to a semiconductor integrated circuit chip testing device according to a tenth embodiment of the invention. The semiconductor integrated circuit chip testing device comprises the supersonic acoustic wave beam producing device 9, the supersonic acoustic wave beam lens 10, the sample stand 11, the voltage detecting device 16, the system controlling and signal processing device 12, and the image and wave displaying device 13. The device of FIG. 16 carries out operation of the method of FIGS. 13, 14, and 15. A device for carrying out the method of FIGS. 13, 14, and 15 may comprise the similar parts of the device of FIG. 12. In this event, the device is used when the voltage detecting device 16 detects a small change of voltage which is supplied between the source terminal 4 and the ground terminal 8 of the semiconductor integrated circuit while the chip 2 is supplied with the supersonic acoustic wave beam 5.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method of testing a semiconductor integrated circuit chip, comprising the steps of:

scanning an ultrasonic wave beam across a semiconductor integrated circuit chip; and detecting a change of a current in a semiconductor integrated circuit in said semiconductor integrated circuit chip as said semiconductor integrated circuit chip is scanned with said ultrasonic wave beam.

2. A device for testing a semiconductor integrated circuit chip, comprising:

ultrasonic wave beam projecting means for scanning an ultrasonic wave beam across a semiconductor integrated circuit chip; and current change detector for detecting a change of a current in a semiconductor integrated circuit in said semiconductor integrated circuit chip.

3. A device for testing a semiconductor integrated circuit chip, comprising:

an ultrasonic wave beam projector for scanning an ultrasonic wave beam across a semiconductor integrated circuit chip; and current change detector for detecting a change of a current in a semiconductor integrated circuit in said semiconductor integrated circuit chip.

* * * * *